(12) United States Patent
Kuroe et al.

(10) Patent No.: US 10,928,696 B2
(45) Date of Patent: Feb. 23, 2021

(54) WIRING SUBSTRATE AND DISPLAY PANEL

(71) Applicant: Sharp Kabushiki Kaisha, Sakai (JP)

(72) Inventors: Yasuhiro Kuroe, Sakai (JP); Noriyuki Ohashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/819,295

(22) Filed: Mar. 16, 2020

(65) Prior Publication Data

US 2020/0301219 A1 Sep. 24, 2020

Related U.S. Application Data

(60) Provisional application No. 62/819,704, filed on Mar. 18, 2019.

(51) Int. Cl.
*G02F 1/1362* (2006.01)
*G09G 3/36* (2006.01)

(52) U.S. Cl.
CPC ..... *G02F 1/136286* (2013.01); *G09G 3/3677* (2013.01); *G02F 2001/13629* (2013.01)

(58) Field of Classification Search
CPC ..... G02F 1/136286; G02F 2001/13629; G02F 1/13458; G02F 1/1345; G09G 3/3677; H05K 3/00
See application file for complete search history.

(56) References Cited

FOREIGN PATENT DOCUMENTS

| JP | 2010-243524 A | 10/2010 |
|---|---|---|
| JP | 2016-218130 A | 12/2016 |

*Primary Examiner* — Charles V Hicks
(74) *Attorney, Agent, or Firm* — Keating & Bennett, LLP

(57) ABSTRACT

A wiring substrate includes signal input portions for inputting signals, a signal receiving portion that receives the signals input from the signal input portions, and a plurality of connection wires provides connections between the signal input portions and the signal receiving portion. The plurality of connection wires constitutes a connection wire group in which three connection wires are arranged overlapping one another with insulating layers being interposed therebetween, and the connection wire group is provided with a switching contact portion at which transmission paths of the signals respectively input to the connection wires are switched to the other connection wires.

11 Claims, 14 Drawing Sheets

WIRING SUBSTRATE AND DISPLAY PANEL

CROSS-REFERENCE TO RELATED APPLICATION

The present application claims priority to U.S. Provisional Application Ser. No. 62/819,704 filed Mar. 18, 2019, the content to which is hereby incorporated by reference into this application.

BACKGROUND OF THE INVENTION

1. Field of the Invention

The present invention relates to a wiring substrate and a display panel.

2. Description of the Related Art

In recent years, with a size reduction and a density increase in electronic equipment, addressing the size reduction and the density increase has also been needed for wiring substrates. For example, in liquid-crystal panels, which are display panels for information terminal apparatuses, such as mobile phones, smartphones, and tablet notebook personal computers, and electronic equipment, such as computers, there are demands for higher densities of images, that is, higher densities of wires. This type of display panel comprises a driver having an LSI that drives the display panel by processing input signals supplied from a signal-supply source and supplying the input signals to a display portion. A COG (Chip On Glass) mounting technique in which a driver is directly mounted on various wires (terminals) provided in a non-display portion (NAA) outside a display portion (AA) of the display panel is used as a driver mounting method (see Japanese Unexamined Patent Application Publication No. 2010-243524).

As shown in FIG. 17, in this type of display panel, for example, a plurality of input terminal portions connected to a plurality of output terminal portions of a driver 1 and a plurality of connection wires 2, such as image signal wires and control signal wires, which are routed from the input terminal portions toward the display portion (AA), are provided in the non-display portion (NAA). Many input terminal portions are arranged along the long-side direction of the driver 1 in a juxtaposed manner in accordance with the definition (resolution) of the display portion (AA), and the connection wires 2 are obliquely routed so as to extend from the input terminal portions to the display portion (AA) in a fan shape. Thus, for example, when the definition of the display portion (AA) is increased to increase the number of connection wires 2, or when the size of the driver 1 is reduced, it is necessary to perform wiring design so that short-circuiting in the oblique wiring portion or an increase in wiring resistances owing to a reduction in the wire pitch does not occur. However, since reductions in the wire width and the inter-wire space are limited, and a seal portion where two substrates are bonded together also overlaps the wire area, there is also a need for ensuring an inter-wire space for UV-curing the seal portion. Thus, the distance between the input terminal portions (the mounting area of the driver 1) and the display portion (AA) needs to be increased, and consequently, the size of the non-display portion (NAA), that is, a bezel portion, increases, thus causing a problem, such as an increase in the outer shape of the display panel.

Accordingly, a technology has been proposed in which adjacent connection wires 2 in the oblique wiring portion of the connection wires 2 are configured to have a multi-layer structure with an insulating layer being interposed therebetween (see Japanese Unexamined Patent Application Publication No. 2016-218130). According to such a technology, the distance between the input terminal portions and the display portion (AA) can be kept small while solving the above-described problem.

SUMMARY OF THE INVENTION

However, when such connection wires are configured to have a multi-layer structure, for example, it has been found that a failure, such as image irregularity, occurs in the display panel. This is thought to be due to mutual influences of potential differences between connection wires configured to have a multi-layer structure or due to a difference between material resistance values when connection wires of different materials are used.

One aspect of the present invention has been completed based on a situation as described above, and an object thereof is to provide a wiring substrate that obtains uniform signals even when connection wires formed on a wiring substrate are overlappingly arranged. Also, an object is to provide a display panel that uses such a wiring substrate and that can obtain uniform signals.

(1) One embodiment of the present invention is a wiring substrate that comprises: signal input portions for inputting signals; a signal receiving portion that receives the signals input from the signal input portions; and a plurality of connection wires that provides connections between the signal input portions and the signal receiving portion. The plurality of connection wires constitutes a connection wire group in which n (n is a natural number greater than or equal to 2) connection wires are arranged overlapping one another with an insulating layer being interposed therebetween, and the connection wire group is provided with a switching contact portion at which transmission paths of the signals respectively input to the connection wires are switched to the other connection wires.

(2) Also, one embodiment of the present invention is a wiring substrate in which, in addition to the configuration (1) described above, a total of (n−1) switching contact portions are provided at positions at which the connection wire group is divided into n.

(3) Also, one embodiment of the present invention is a wiring substrate in which, in addition to the configuration (1) or (2) described above, the switching contact portions are provided at positions at which the connection wire group is equally divided into n.

(4) Also, one embodiment of the present invention is a wiring substrate in which, in addition to any one of the configurations (1) to (3) described above, the connection wire group is constituted by n neighboring connection wires.

(5) Also, one embodiment of the present invention is a wiring substrate in which, in addition to any one of the configurations (1) to (3), the connection wire group is constituted by n connection wires through which same-polarity signals are transmitted.

(6) Also, one embodiment of the present invention is a wiring substrate in which, in addition to any one of the configurations (1) to (5) described above, in one switching contact portion, the overlapping arrangement of n overlappingly arranged connection wires in the connection wire group is partly dissolved, the n connection wires are placed side by side and have n unit contacts that provide conductive connection between one connection wire and another connection wire, and the n unit contacts are aligned in a direction that intersects a direction orthogonal to an extending direction of the connection wires that are placed side by side.

(7) Also, one embodiment of the present invention is a wiring substrate in which, in addition to any one of the configurations (1) to (6) described above, the signal input portions are or the signal receiving portion is placed in a straight line; and one switching contact portion in one connection wire group is arranged to be obliquely displaced relative to the neighboring switching contact portion in the neighboring connection wire group and the signal input portions or the signal receiving portion placed in the straight line.

(8) Also, one embodiment of the present invention is a wiring substrate in which, in addition to any one of the configurations (1) to (7) described above, the signal receiving portion comprises pixel wires connected to a plurality of pixels for displaying an image, the pixels being located in a display area in which the pixels are formed; the signal input portions are pixel signal input portions for inputting signals to the pixel wires; and the plurality of connection wires is routed from the plurality of pixel signal input portions to the plurality of pixel wires so as to extend in a fan shape.

(9) Also, one embodiment of the present invention is a wiring substrate in which, in addition to the configuration (8) described above, the pixel wires include a scan wire made of a first electrical conductor, an image wire made of a second electrical conductor, and a common-electrode connection wire made of a third electrical conductor; and the connection wire group includes a first connection wire made of the first electrical conductor, a second connection wire made of the second electrical conductor, and a third connection wire made of the third electrical conductor.

(10) Also, one embodiment of the present invention is a wiring substrate in which, in addition to the configuration (8) or (9) described above, the connection wires are provided with a drive circuit for driving the pixel wires, and the connection wire group is provided between the pixel signal input portions and the drive circuit.

(11) Also, one embodiment of the present invention is a display panel comprising: the wiring substrate according to any one of (1) to (10); and an opposing substrate that is bonded to the wiring substrate so as to oppose the wiring substrate.

According to one aspect of the present invention, a wiring substrate that can obtain uniform signals can be provided even when connection wires formed on a wiring substrate are overlappingly arranged. Also, a display panel that uses such a wiring substrate and that can obtain uniform signals is provided.

DETAILED DESCRIPTION OF THE INVENTION

First Embodiment

Figure 1:
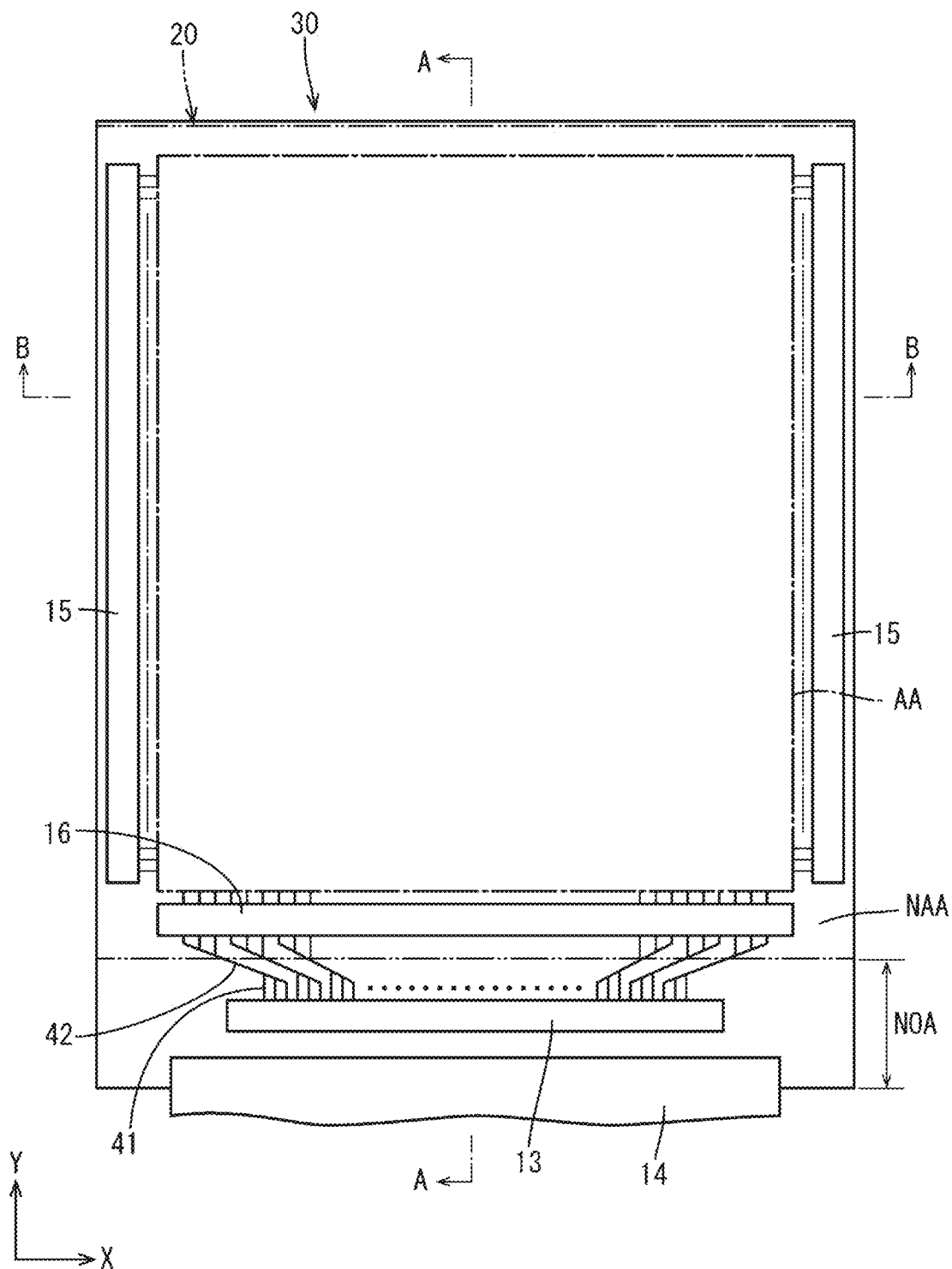
FIG. 1 is a plan view of an array substrate in a first embodiment.
Figure 2:
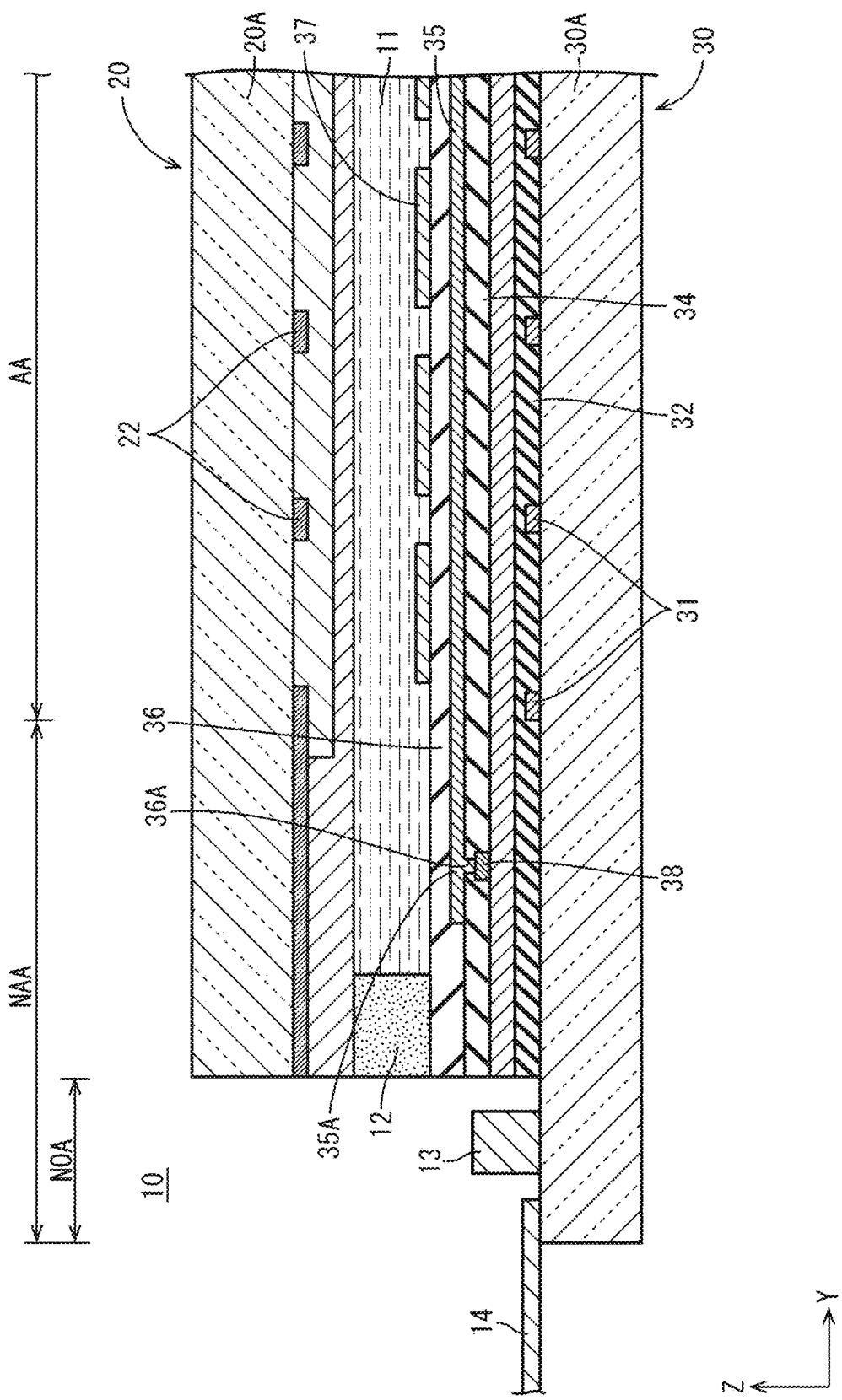
FIG. 2 is a sectional view of a liquid-crystal panel along line A-A in FIG. 1.
Figure 3:
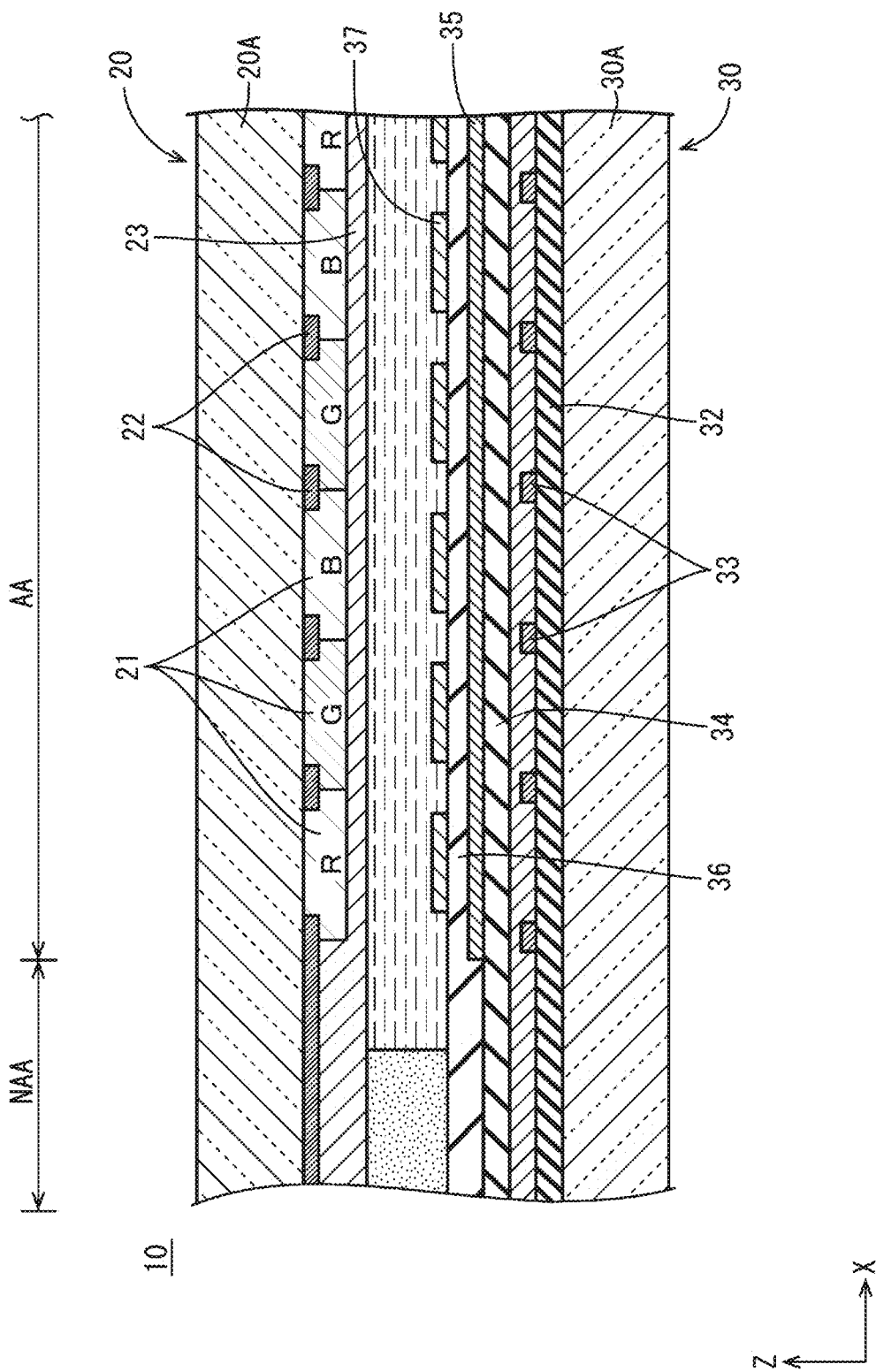
FIG. 3 is a sectional view of the liquid-crystal panel along line B-B in FIG. 1.

A liquid-crystal panel (one example of a display panel) 10 in a first embodiment will be described with reference to FIGS. 1 to 11. An X-axis, a Y-axis, and a Z-axis are illustrated in some of the drawings, and the directions of the axes are depicted as corresponding to directions shown in the respective drawings. Also, the upper side in FIGS. 2 and 3 is an obverse side, and the lower side therein is a reverse side. Also, with respect to the same members, a reference numeral may be given to one member and may be omitted for the other members.

The liquid-crystal panel 10 according to the present embodiment is used for various types of electronic equipment (not illustrated), such as portable information terminals (including an electronic book, a PDA, and so on), mobile phones (including a smartphone and so on), notebook computers (including a tablet notebook personal computer and so on), digital photo frames, portable game consoles, and electronic ink paper. Thus, the liquid-crystal panel 10 has a screen size of about a few inches to about a dozen inches and generally has a size that is classified into a small size or a small to medium size. The screen size is not particularly limiting, and the present technology can be applied to display panels that are classified into a medium size or large (super large) size that are few tens of inches or more.

A schematic configuration of the liquid-crystal panel 10 will be described first. The liquid-crystal panel 10 has a vertically long, square shape (rectangular shape) in plan view as a whole, the long-side direction thereof matches a Y-axis direction, and the short-side direction matches an X-axis direction. The liquid-crystal panel 10 is sectioned into a display area (an active area) AA (a range surrounded by a dashed-and-dotted line in FIG. 1), in which an image can be displayed, and a non-display area (a non-active area) NAA, which forms a bezel shape (a frame shape) surrounding the display area AA and in which an image cannot be displayed. A back side of the liquid-crystal panel 10 comprises, for example, a backlight device, and the liquid-crystal panel 10 is illuminated with light from the back side.

As shown in FIGS. 2 and 3, the liquid-crystal panel 10 comprises at least a pair of substrates 20 and 30 that are generally transparent, that are, for example, made of glass, and that are bonded to each other in a form in which inner surfaces thereof oppose each other with a predetermined interval (cell gap) being placed therebetween, a liquid-crystal layer 11 that is enclosed between both the substrates 20 and 30, and a seal portion 12 that is interposed between both the substrates 20 and 30 and that holds a gap corresponding to the thickness of the liquid-crystal layer 11 to seal the liquid-crystal layer 11. An obverse side of the pair of substrates 20 and 30 is a CF substrate (one example of an opposing substrate) 20, and a reverse side (a back side) thereof is an array substrate (one example of a wiring substrate) 30.

The CF substrate 20 of the pair of substrates 20 and 30 has a long-side dimension made to be smaller than the long-side dimension of the array substrate 30 and is bonded thereto in a form in which an end portion of the CF substrate 20 is aligned with an end portion of the array substrate 30 with respect to the long-side direction. Accordingly, the other end portion of the array substrate 30 with respect to the long-side direction is a substrate-non-overlapping portion NOA that the CF substrate 20 does not overlap. The substrate-non-overlapping portion NOA is a portion of the non-display area NAA.

A driver 13 and a flexible substrate 14 are in conductive contact with terminal portions of the substrate-non-overlapping portion NOA. The flexible substrate 14 has flexibility and provides connections between the liquid-crystal panel 10 and a control substrate, which is an external signal-supply source, to thereby allow various signals supplied from the control substrate to be transmitted to the liquid-crystal panel 10 side (such as the driver 13).

The driver 13 is assumed to be implemented by an IC chip, such as an LSI, having a drive circuit therein, is assumed to process input signals, supplied from the control substrate, to generate output signals and output the output signals to wires connected to the driver 13. This driver 13 has a vertically long, square shape (has a longitudinal shape along the short side of the liquid-crystal panel 10) in plan view and is COG (Chip On Glass) mounted on the non-display area NAA on the array substrate 30 in the liquid-crystal panel 10. The long-side direction of the driver 13 matches the X-axis direction (the short-side direction of the liquid-crystal panel 10), and the short-side direction of the driver 13 matches the Y-axis direction (the long-side direction of the liquid-crystal panel 10). Also, a pair of obverse-side and reverse-side polarizers is attached to outer surface sides of the pair of substrates 20 and 30.

A large number of TFTs (thin-film transistors and switching elements) and a large number of pixel electrodes 37 are aligned along the X-axis direction and the Y-axis direction and are provided in a matrix at an inner surface side (the liquid-crystal layer 11 side, the opposing-surface side that opposes the CF substrate 20) of the array substrate 30, the inner surface side being located in the display area AA, and gate wires (scan wires) 31 and source wires (signal wires and data wires) 33, which form a generally lattice shape and are both made of metallic material, are disposed around the TFTs and the pixel electrodes 37 so as to surround the TFTs and the pixel electrodes 37. The gate wires 31 extend along the X-axis direction, whereas the source wires 33 extend along the Y-axis direction.

The gate wires 31 are made of a first metal film (a first conductive film), which is formed by, for example, patterning metallic material at an inner surface side of a light-transmissive substrate 30A in the array substrate 30. The source wires 33 are made of a second metal film (a second conductive film), which is formed by patterning metallic material at an upper layer side (an inner surface side) of the first metal film with a first insulating layer 32 being interposed therebetween. The first metal film and the second metal film can be formed of, for example, a single layer film made of one type of metallic material selected from copper, titanium, aluminum, molybdenum, tungsten, and so on or a stacked film or alloy made of different types of metallic material. The gate wires 31 and the source wires 33 are connected to gate electrodes and source electrodes, respectively, of the corresponding TFTs, and the pixel electrodes 37 are connected to drain electrodes of the TFTs.

The TFTs are driven based on various signals respectively supplied to the gate wires 31 and the source wires 33 and are adapted so that supply of potentials to the pixel electrodes 37 is controlled in conjunction with the driving. The pixel electrodes 37 have a vertically long, square shape (rectangular shape) in plan view and have a plurality of slits. Capacitance wires that are parallel to the gate wires 31 and that overlap the pixel electrodes 37 with an insulating film being interposed therebetween while crossing the pixel electrodes 37 can also be provided in the array substrate 30.

A common electrode 35 is formed in a form in which it overlaps all the pixel electrodes 37, as shown in FIGS. 2 and 3, at the inner surface side of the array substrate 30 which is located in the display area AA. The common electrode 35 is placed at a lower layer side than the pixel electrodes 37 (at a far side from the liquid-crystal layer 11) and at an upper layer side than the TFTs, the gate wires 31, and the source wires 33. The common electrode 35 is placed at an upper layer side (inner surface side) of the second metal film (the source wires 33) in a form in which a second insulating layer (planarization film) 34 is interposed therebetween. This prevents short-circuiting of both the common electrode 35 and the source wires 33, and also planarizes the formation surface of the common electrode 35. Also, a third insulating layer 36 (a planarization film) is placed in a form in which it is interposed between the common electrode 35 and the pixel electrodes 37, which are placed at an upper layer side of the common electrode 35, to thereby prevent short-circuiting of both the common electrode 35 and the pixel electrodes 37, and planarize the formation surface of the pixel electrodes 37.

The common electrode 35 is an electrode to which a substantially constant reference potential is supplied and that extends uniformly through substantially the entire area of the display area AA. Upon charging of the pixel electrodes 37, when a potential difference occurs between the pixel electrodes 37 and the common electrode 35, which overlap each other, a fringing electric field (an oblique electric field) including components in a direction that is normal to a plate surface of the array substrate 30 occurs between opening edges of the slits in the pixel electrodes 37 and the common electrode 35, in addition to components along the plate surface of the array substrate 30. Thus, the alignment state of liquid-crystal molecules included in the liquid-crystal layer 11 can be controlled utilizing the fringing electric field. That is, the operation mode of the liquid-crystal panel 10 according to the present embodiment is set to an FFS (Fringe Field Switching) mode. The pixel electrodes 37 and the common electrode 35 are formed of transparent electrode material (for example, ITO (Indium Tin Oxide), IZO (Indium Zinc Oxide), or the like).

A common-electrode connection portion 35A connected to the common electrode 35 is connected to a common-electrode connection wire 38 connected to the driver 13, so that a reference potential signal is supplied from the driver 13 to the common electrode 35. The common-electrode connection portion 35A is placed in the same layer (the third insulating layer 36) as that of the common electrode 35 and is also formed of the same transparent electrode material as that of the common electrode 35. Also, the common-electrode connection wire 38 is placed in the second insulating layer 34 and is also formed of a third metal film (a third conductive film). That is, the common-electrode connection wire 38 is placed at a lower layer side relative to the third insulating layer 36. Further, the common-electrode connection portion 35A and the common-electrode connection wire 38 are electrically connected through a contact hole 36A formed in the third insulating layer 36 in an overlapping area in plan view. Similarly to the first metal film and the second metal film, the third metal film can be formed of, for example, a single layer film made of one type of metallic material selected from copper, titanium, aluminum, molybdenum, tungsten, and so on or a stacked film or alloy made of different types of metallic material.

Meanwhile, three-color color filters 21 that exhibit red (R), green (G), and blue (B) are provided at the inner surface side of the CF substrate 20 which is located in the display area AA, as shown in FIG. 3. A large number of color filters 21 that exhibit colors that differ from each other are repeatedly aligned along the gate wires 31 (the X-axis direction), and these color filters 21 extend along the source wires 33 (the Y-axis direction), so that the color filters 21 are arrayed in a striped pattern as a whole. These color filters 21 are arranged overlapping the respective pixel electrodes 37 at the array substrate 30 side in plan view. A light shielding portion 22 having a generally lattice shape partitions the neighboring color filters 21 that display mutually different colors. In the liquid-crystal panel 10, the R, G, and B color filters 21 aligned along the X-axis direction and the three pixel electrodes 37 that oppose the corresponding color filters 21 constitute each three-color pixel portion. Further, in the liquid-crystal panel 10, three-color R, G, and B pixel portions that are neighboring each other along the X-axis direction constitute display pixels that can perform predetermined-gradation color display.

An overcoat film 23 is formed at an inner surface side of the color filters 21. Alignment films for aligning the liquid-crystal molecules included in the liquid-crystal layer 11 are respectively formed on innermost surfaces of both the substrates 20 and 30, the innermost surfaces being in contact with the liquid-crystal layer 11.

Next, a description will be given of a structure in which the flexible substrate 14 and the driver 13 are connected to the non-display area NAA of the array substrate 30. An end portion of the flexible substrate 14 and the driver 13 are attached to the substrate-non-overlapping portion NOA that is included in the non-display area NAA of the array substrate 30 and that does not overlap the CF substrate 20, as shown in FIG. 1. The end portion of the flexible substrate 14 is placed at an end portion of the array substrate 30 along the short-side direction (the X-axis direction), whereas the driver 13 is positioned closer to the display area AA side than the flexible substrate 14 and is placed on the array substrate 30. In other words, the driver 13 is placed at a position that is included in the non-display area NAA and that is sandwiched between the display area AA and the flexible substrate 14. Predetermined intervals are given between the flexible substrate 14 and the driver 13 and between the driver 13 and the display area AA with respect to the long-side direction of the array substrate 30.

The end portion of the flexible substrate 14 is attached to a center portion in an end portion at the short-side side of the array substrate 30. Meanwhile, the driver 13 is mounted on a center portion in the non-display area NAA with respect to the short-side direction of the array substrate 30, with an orientation in which the long-side direction of the driver 13 matches the short-side direction (the X-axis direction) of the array substrate 30. The driver 13 is arranged to be generally concentric with the flexible substrate 14 with respect to the short-side direction of the array substrate 30. The driver 13 processes various signals from the external signal-supply source (the control substrate), the various signals being transmitted through the flexible substrate 14, and outputs output signals to the display area AA. In FIG. 1, only some of the wires between the driver 13 and the display area AA are illustrated, and other wires are omitted.

As shown in FIG. 1, row control circuit portions 15 and a column control circuit portion 16 that are connected to the gate wires 31 and the source wires 33 in the display area AA to thereby perform control for supplying signals, input from the driver 13, to the TFTs are provided at positions that are included in the non-display area NAA of the array substrate 30 and that are neighboring the long side and the short side in the display area AA. The row control circuit portions 15 and the column control circuit portion 16 are monolithically formed on the array substrate 30 by using a CG silicon thin-film, which is the same as that of the TFTs, as a base to thereby have a control circuit for controlling supply of input signals to the TFTs. These row control circuit portions 15 and the column control circuit portion 16 are simultaneously patterned on the array substrate 30 by a known photolithography method, when the gate wires 31, the source wires 33, the various insulating films, the gate electrodes, the source electrodes, the drain electrodes, semiconductor films, and so on that constitute the TFTs are patterned in a manufacturing process of the liquid-crystal panel 10 (the array substrate 30).

The row control circuit portions 15 of those described above are placed at positions that are neighboring the long sides at the right and left sides of the display area AA, the long sides being shown in FIG. 1, and are formed in vertically long, square shape ranges that extend along the Y-axis direction. The row control circuit portions 15 have a long-side dimension that is sized to be roughly the same as the long-side dimension of the display area AA. The row control circuit portions 15 have a scanning circuit that is connected to the gate wires 31 placed in the display area AA and also that supplies control signals, included in input signals from the driver 13, to the gate wires 31 at a predetermined timing to sequentially scan the gate wires 31. Specifically, the row control circuit portions 15 cause the scanning circuit to sequentially supply, from the left end position to the right end position shown in FIG. 1, control signals (scan signals) from the driver 13 to many gate wires 31, which are arranged in the display area AA of the array substrate 30 along the X-axis direction in a juxtaposed manner, to thereby scan the gate wires 31. Also, the row control circuit portions 15 comprise accessory circuits, such as a level shifter circuit, a buffer circuit, and an ESD (Electro-Static Discharge) protection circuit.

In contrast, the column control circuit portion 16 is placed at a position that is neighboring the short side of the lower side of the display area AA, the short side being shown in FIG. 1, and that is located between the display area AA and the driver 13 with respect to the Y-axis direction, and is formed in a vertically long, square shaped range that extends in the X-axis direction. The column control circuit portion 16 has a long-side dimension that is sized to be roughly the same as the short side dimension of the display area AA. The column control circuit portion 16 has a switch circuit (an RGB switch circuit) that is connected to the source wires 33 placed in the display area AA and that distributes image signals, included in input signals from the driver 13, to the source wires 33. Specifically, many source wires 33 are arranged along the Y-axis direction in the display area AA of the array substrate 30 in a juxtaposed manner and are respectively connected to the TFTs included in the pixels for the R (red), G (green), and B (blue) colors, and the column control circuit portion 16 causes the switch circuit to distribute and supply the image signals from the driver 13 to the source wires 33 for R, G, and B. Also, the column control circuit portion 16 comprises accessory circuits, such as a level shifter circuit and an ESD protection circuit.

Figure 4:
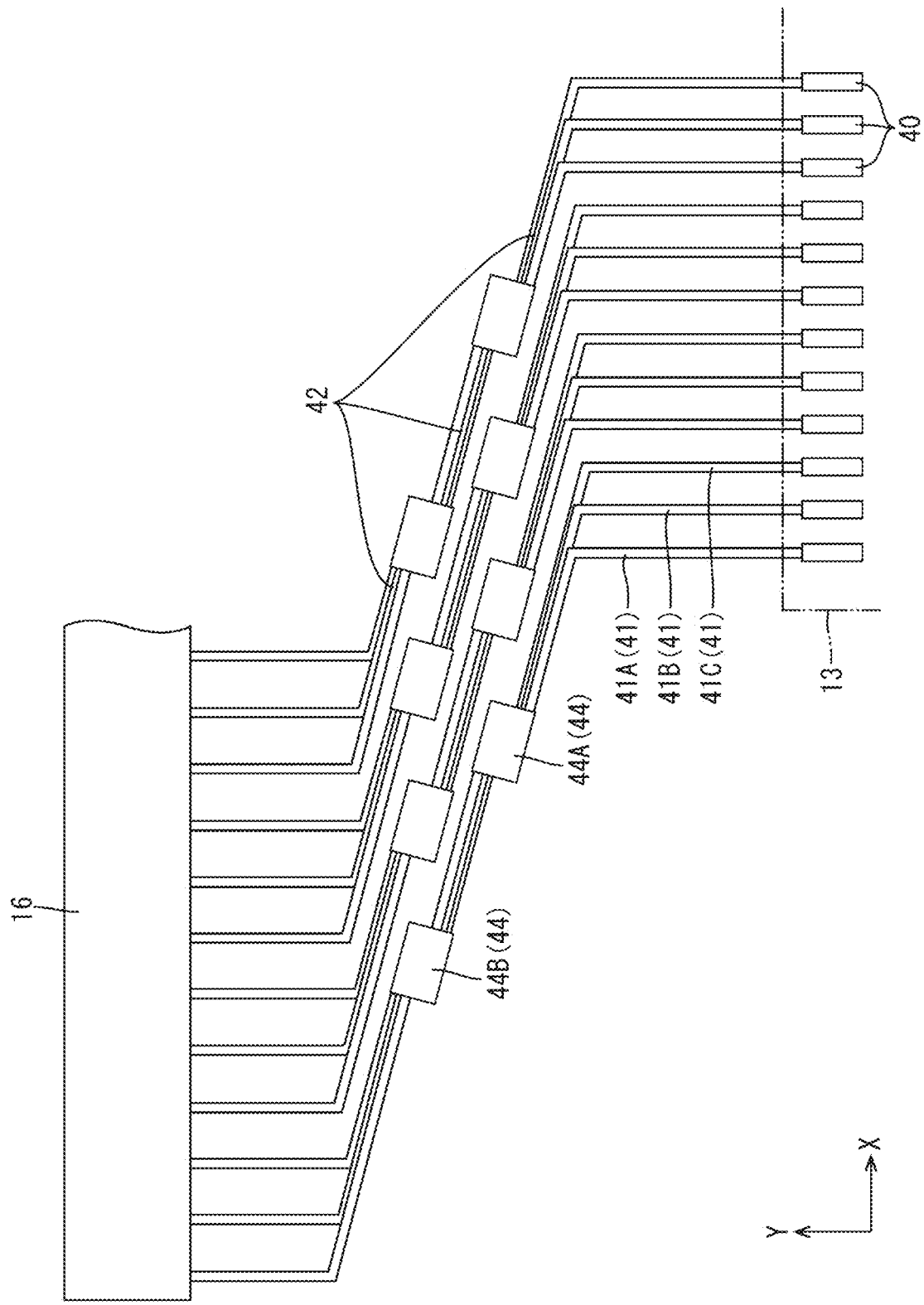
FIG. 4 is a schematic diagram showing a wiring structure in a non-display area of the array substrate.

As shown in FIG. 4, a plurality of signal input terminals (one example of signal input portions) 40 to which signals output from the driver 13 are input is provided in the mounting area (denoted by a long dashed double-short dashed line in FIG. 4) of the driver 13 in the substrate-non-overlapping portion NOA and is electrically and mechanically connected to the driver 13, for example, through an anisotropic conductive film (ACF: Anisotropic Conductive Film), not illustrated. The plurality of signal input terminals 40 have an arrangement in which many signal input terminals are arranged side by side in a straight line along the X-axis direction, that is, along the long-side direction (the array direction of the source wires 33) of the driver 13, with a predetermined interval being provided therebetween. The signal input terminals 40 are made of, for example, the first metal film that is the same as that of the gate wires 31, and surfaces of the signal input terminals 40 are covered by transparent electrode material, such as ITO or ZnO, that is the same as that of the pixel electrodes 37. Accordingly, during patterning of the gate wires 31, the common electrode 35, and so on in the manufacturing process of the liquid-crystal panel 10 (the array substrate 30), the signal input terminals 40 are patterned on the array substrate 30 simultaneously therewith by a known photolithography method.

Further, a plurality of image signal wires (one example of connection wires) 41 that provides connections between the signal input terminals 40, which are connected to the driver 13, and the above-described column control circuit portion 16 to allow image signals to be transmitted is provided in the non-display area NAA of the array substrate 30. Although details are described next, these image signal wires 41 are made of the first metal film, which forms the gate wires 31, the second metal film, which forms the source wires 33, and the third metal film, which forms the common-electrode connection wire 38, and during patterning of the gate wires 31, the source wires 33, and the common-electrode connection wire 38 in the manufacturing process of the liquid-crystal panel 10 (the array substrate 30), the image signal wires 41 are patterned on the array substrate 30 simultaneously therewith by a known photolithography method.

As shown in FIG. 4, end portions of one side (an opposite side of the display area AA side) of the image signal wires 41 are connected to the signal input terminals 40, and end portions of the other side (the display area AA side) are connected to a long-side portion of the column control circuit portion 16 along the X-axis direction. The image signal wires 41 are routed in a form that crosses an area between the signal input terminals 40 and the column control circuit portion 16 in the non-display area NAA of the array substrate 30. More specifically, end portions of one side of the image signal wires 41 are individually connected to the signal input terminals 40 arranged along the X-axis direction in a juxtaposed manner, and the image signal wires 41 are laid out from the signal input terminals 40 in a form in which many image signal wires 41 are juxtaposed along the X-axis direction. Also, end portions of the other side of the image signal wires 41 are connected in a form in which many image signal wires 41 are juxtaposed along the long-side portion of the column control circuit portion 16 along the X-axis direction.

Meanwhile, when comparison is performed between the formation range of the plurality of signal input terminals 40 to which the image signal wires 41 are connected and the formation range of the column control circuit portion 16 is performed with respect to the X-axis direction, the formation range of the column control circuit portion 16 is made larger than the formation range of the group of signal input terminals 40. This is primarily because the number of source wires 33 connected to the column control circuit portion 16 is up to about three times of the number of image signal wires 41. Accordingly, of both the end portions of each image signal wire 41, the end portion that is adjacent to the signal input terminal 40 is placed at a center side of the array substrate 30 with respect to the X-axis direction, whereas the end portion that is adjacent to the column control circuit portion 16 is placed at an end side of the array substrate 30 with respect to the X-axis direction. Thus, the image signal wires 41 laid out from the signal input terminals 40 extend in a fan shape in a process of being routed from the signal input terminal 40 side to the column control circuit portion 16 side.

Further, with such a configuration, when the screen size of the liquid-crystal panel 10 increases, or the widths of the driver 13 and the flexible substrate decrease, an oblique wiring portion, which is obliquely made, at the signal input terminal 40 side of the image signal wires 41 becomes too dense, thus causing a risk of short-circuiting between the neighboring image signal wires 41. In order to suppress the short-circuiting, the dimension of the routing area of the image signal wires 41 in the Y-axis direction must be increased, and thus there is a problem that the size of the array substrate 30 increases.

With regard to such a problem, in the present embodiment, an image-signal wire group 42 having an arrangement in which three neighboring image signal wires 41 overlap one another is constituted. Specifically, the image signal wires 41 laid out from the signal input terminals 40 are repetitions of a unit including three wires, that is, a first image signal wire 41A, a second image signal wire 41B, and a third image signal wire 41C, in sequence from the left side in FIG. 4. These three image signal wires 41A, 41B, and 41C have an arrangement in which they are laid out in parallel to each other from the signal input terminals 40 toward the column control circuit portion 16 side (along the Y-axis direction), are then obliquely routed so as to extend toward the upper left in FIG. 4 in a fan shape, and also overlap one another with insulating layers interposed therebetween, to constitute the image-signal wire group 42. In FIG. 4, for convenience, three image signal wires 41 in the overlapping area are shown as being in a slightly displaced state.

Figure 5:
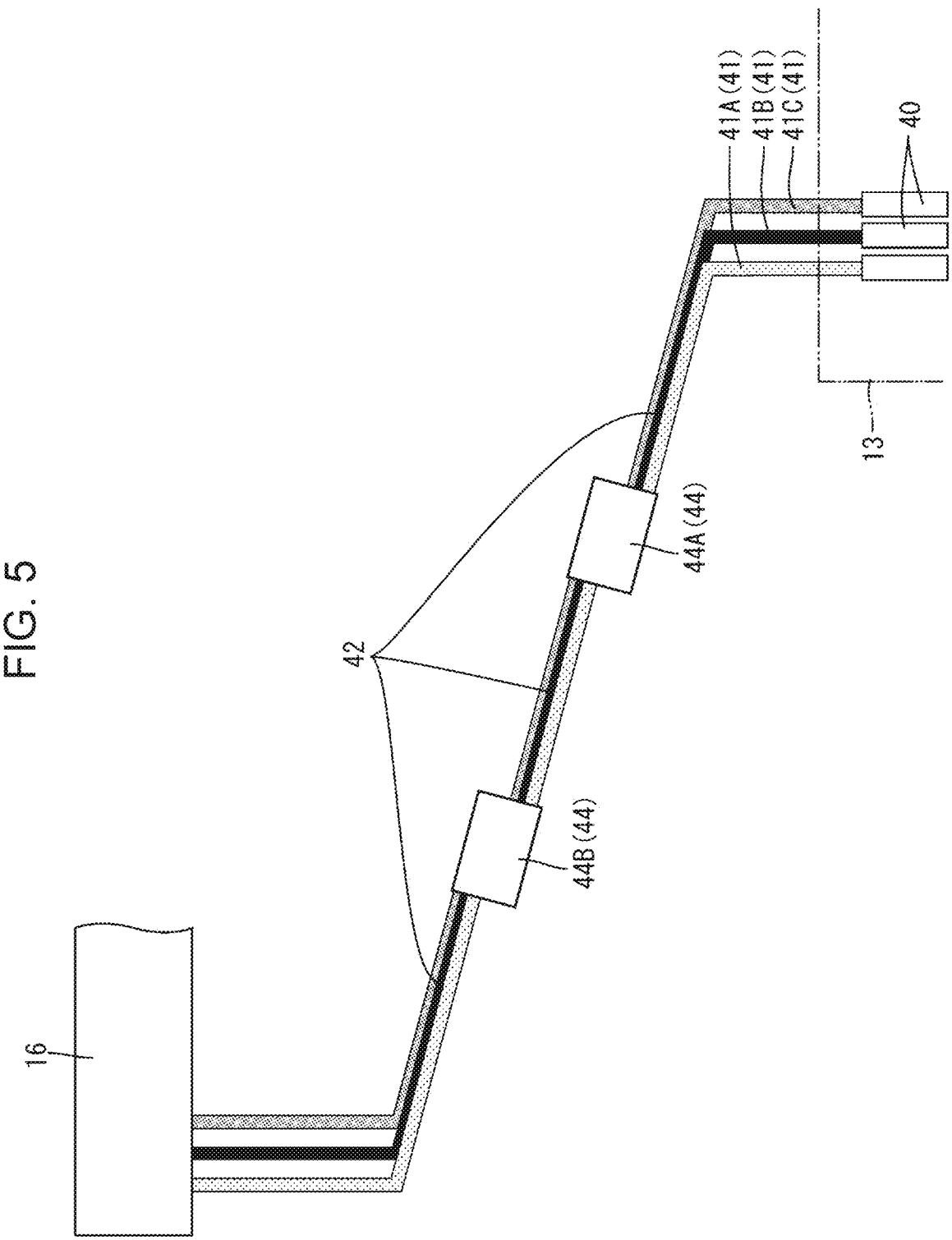
FIG. 5 is a schematic diagram showing a wiring structure of an image-signal wire group.

FIG. 5 is a diagram schematically showing an image-signal wire group 42 (one unit of image signal wires 41A, 41B, and 41C), and in the image-signal wire group 42, the first image signal wire 41A, the second image signal wire 41B, and the third image signal wire 41C sequentially overlap one another from the upper layer side in that order. Also, the overlapping arrangement of this image-signal wire group 42 is dissolved at the column control circuit portion 16 side, and the image-signal wires are individually and orthogonally input to the long side of the column control circuit portion 16. The image signal wires 41 are formed to have wire widths that are slightly reduced or slightly increased from the lower layer to the upper layer, and this is a configuration required in the manufacturing process. In FIG. 5, for convenience, three image signal wires 41 in the overlapping area are also shown as being in a slightly displaced state.

In addition, the image-signal wire group 42 in the present embodiment comprises switching contact portions 44 at positions at which the image-signal wire group 42 (the overlapping area of the image signal wires 41) is equally divided into three portions. The total number of switching contact portions 44 that are provided is two. Hereinafter, the switching contact portion 44 at the signal input terminal 40 side is referred to as a "first switching contact portion 44A", and the switching contact portion at the column control circuit portion 16 side is referred to as a "second switching contact portion 44B". Also, when both are not distinguished therebetween, they are expressed as the switching contact portions 44.

A signal input to each image signal wire 41 from the signal input terminal 40 first undergoes a change of its transmission path in the first switching contact portion 44A. Here, it is assumed that a signal input to the first image signal wire 41A from the signal input terminal 40 is a signal A, a signal input to the second image signal wire 41B is a signal B, a signal input to the third image signal wire 41C is a signal C. In the first switching contact portion 44A, the signal A transmitted through the first image signal wire 41A in the upper layer is adapted to be switched to the second image signal wire 41B in the middle layer, the signal B transmitted through the second image signal wire 41B in the middle layer is adapted to be switched to the third image signal wire 41C in the lower layer, and the signal C transmitted through the third image signal wire 41C in the lower layer is switched to the first image signal wire 41A in the upper layer. Further, each signal is directly transmitted to the second switching contact portion 44B and then undergoes a change of the transmission path again in the second switching contact portion 44B. Specifically, the signal C transmitted through the first image signal wire 41A in the upper layer is adapted to be switched to the second image signal wire 41B in the middle layer, the signal A transmitted through the second image signal wire 41B in the middle layer is adapted to be switched to the third image signal wire 41C in the lower layer, and the signal B transmitted through the third image signal wire 41C in the lower layer is adapted to be switched to the first image signal wire 41A in the upper layer. That is, each signal input to each image signal wire 41 in one image-signal wire group 42 is adapted to be transmitted through all the image signal wires 41 until being input to the column control circuit portion 16, while changing its transmission path in the switching contact portions 44A and 44B.

Figure 6:
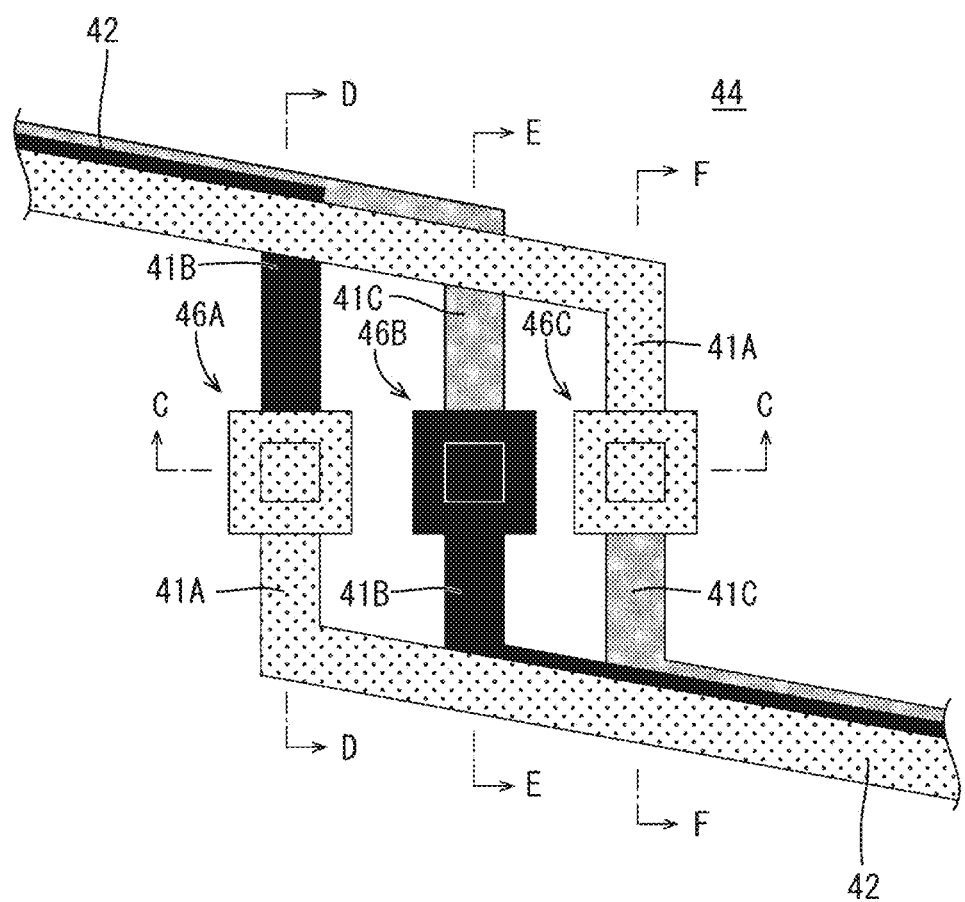
FIG. 6 is a schematic diagram showing a wiring structure of unit contacts in a switching contact portion.

FIG. 6 is a plan view schematically showing a connection structure of the image signal wires 41A, 41B, and 41C in the switching contact portion 44, and FIGS. 7 to 10 are sectional views thereof. As shown in FIG. 6, the overlapping arrangement of three image signal wires 41A, 41B, and 41C (the image-signal wire group 42) that are arranged overlapping one another is partly dissolved in the switching contact portion 44, the three image signal wires 41A, 41B, and 41C are put into a displaced state in terms of a plane, and the wires in each layer are in a temporarily disconnected state. Further, an end portion of a new image signal wire 41 in a different layer is placed so as to overlap the disconnected end portion of each image signal wire 41, and a contact hole in an insulating layer provided between the overlappingly arranged end portions provides connection therebetween.

Figure 7:
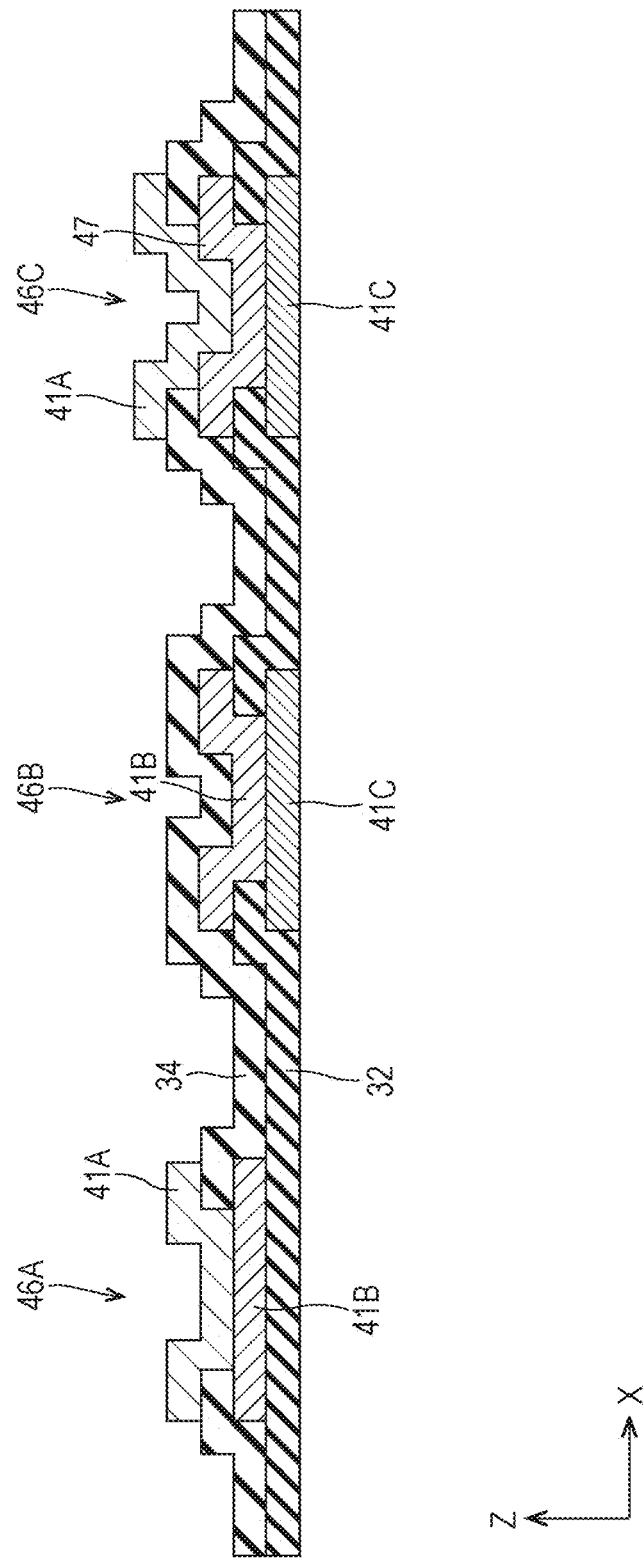
FIG. 7 is a C-C sectional view of FIG. 6.
Figure 8:
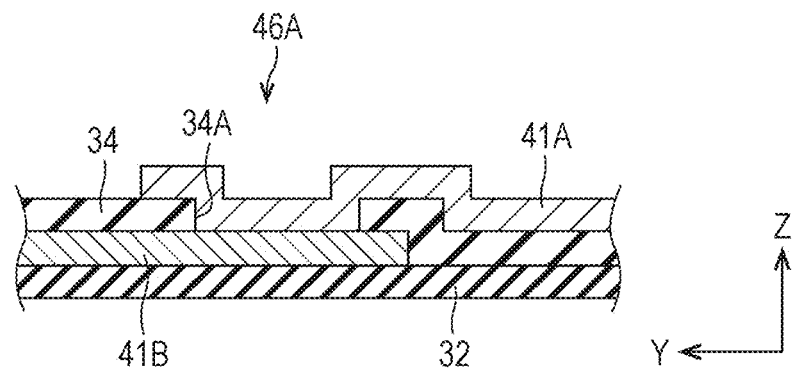
FIG. 8 is a D-D sectional view of FIG. 6.
Figure 9:
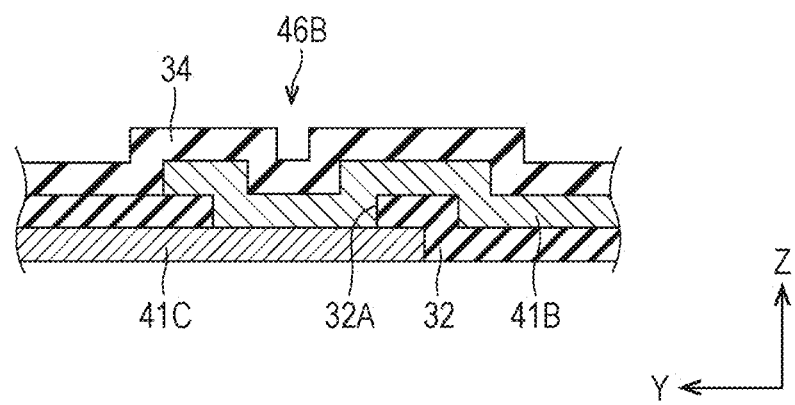
FIG. 9 is an E-E sectional view of FIG. 6.
Figure 10:
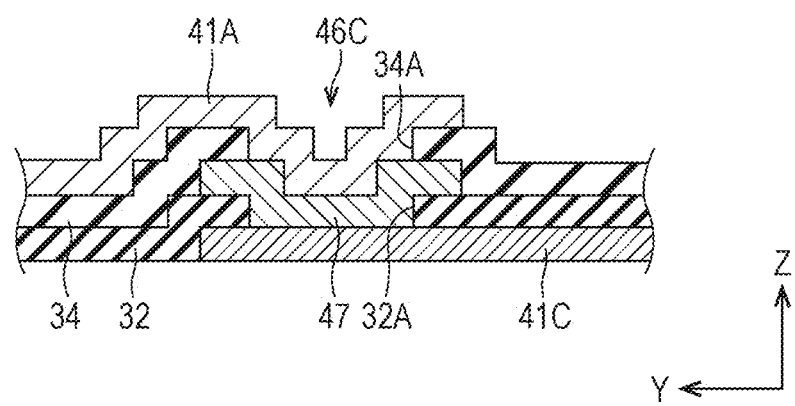
FIG. 10 is an F-F sectional view of FIG. 6.

Specifically, as shown at the left sides in FIGS. 6 and 7 and shown in FIG. 8, an end portion of a new second image signal wire 41B in a middle layer is arranged overlapping an end portion of the first image signal wire 41A arranged in an upper layer, and a contact hole 34A provided in the second insulating layer 34 implements connection between the end portions. Hereinafter, a portion where the first image signal wire 41A and the second image signal wire 41B are connected to each other is referred to as a "first contact 46A" (one example of a unit contact). Also, as shown at the centers in FIGS. 6 and 7 and shown in FIG. 9, an end portion of a new third image signal wire 41C in a lower layer is arranged overlapping an end portion of the second image signal wire 41B arranged in the middle layer, and a contact hole 32A provided in the first insulating layer 32 implements connection between the end portions. Hereinafter, a portion where the second image signal wire 41B and the third image signal wire 41C are connected to each other is referred to as a "second contact 46B" (one example of the unit contact). In addition, as shown at the right sides in FIGS. 6 and 7 and shown in FIG. 10, an end portion of a new first image signal wire 41A in the upper layer is arranged overlapping an end portion of the third image signal wires 41C arranged in the lower layer via a relay portion 47 in the middle layer, the relay portion 47 being provided in the shape of an island, and contact holes 32A and 34A overlappingly provided in the first insulating layer 32 and the second insulating layer 34 implement connection between the end portions. Hereinafter, a portion where the third image signal wire 41C and the first image signal wire 41A are connected to each other via the relay portion 47 is referred to as a "third contact 46C" (one example of the unit contact).

Further, the three new image signal wires 41A, 41B, and 41C connected via those first contact 46A, second contact 46B, and third contact 46C are arranged overlapping one another again to constitute the image-signal wire group 42, which is disposed toward the column control circuit portion 16.

Each signal input to each image signal wire 41 from the signal input terminal 40 is adapted to undergo switching of a wire that serves as its transmission path in each contact 46A, 46B, or 46C in the switching contact portions 44A and 44B and to pass through all the three types of image signal wires 41A, 41B, and 41C until being transmitted from the signal input terminal 40 to the column control circuit portion 16, as described above. With such a configuration, even when the constituent materials, the widths, the thicknesses, and so on of the respective image signal wires 41A, 41B, and 41C are different, uniform output signals can be obtained regardless of their intrinsic resistance values.

The above-described first, second, and third contacts 46A, 46B, and 46C are placed in one switching contact portion 44 along the extending direction of the long side of the column control circuit portion 16, that is, along the alignment direction (the X-axis direction) of the plurality of the source wires 33, as shown in FIG. 6. Thus, the distance in the alignment direction of the column control circuit portion 16 and the signal input terminals 40 is reduced, compared with a case in which the contacts 46A, 46B, and 46C are placed in a direction in which they intersect the extending direction of the image-signal wire group 42. This makes it possible to reduce the width of the non-display area NAA in the Y-axis direction.

Figure 11:
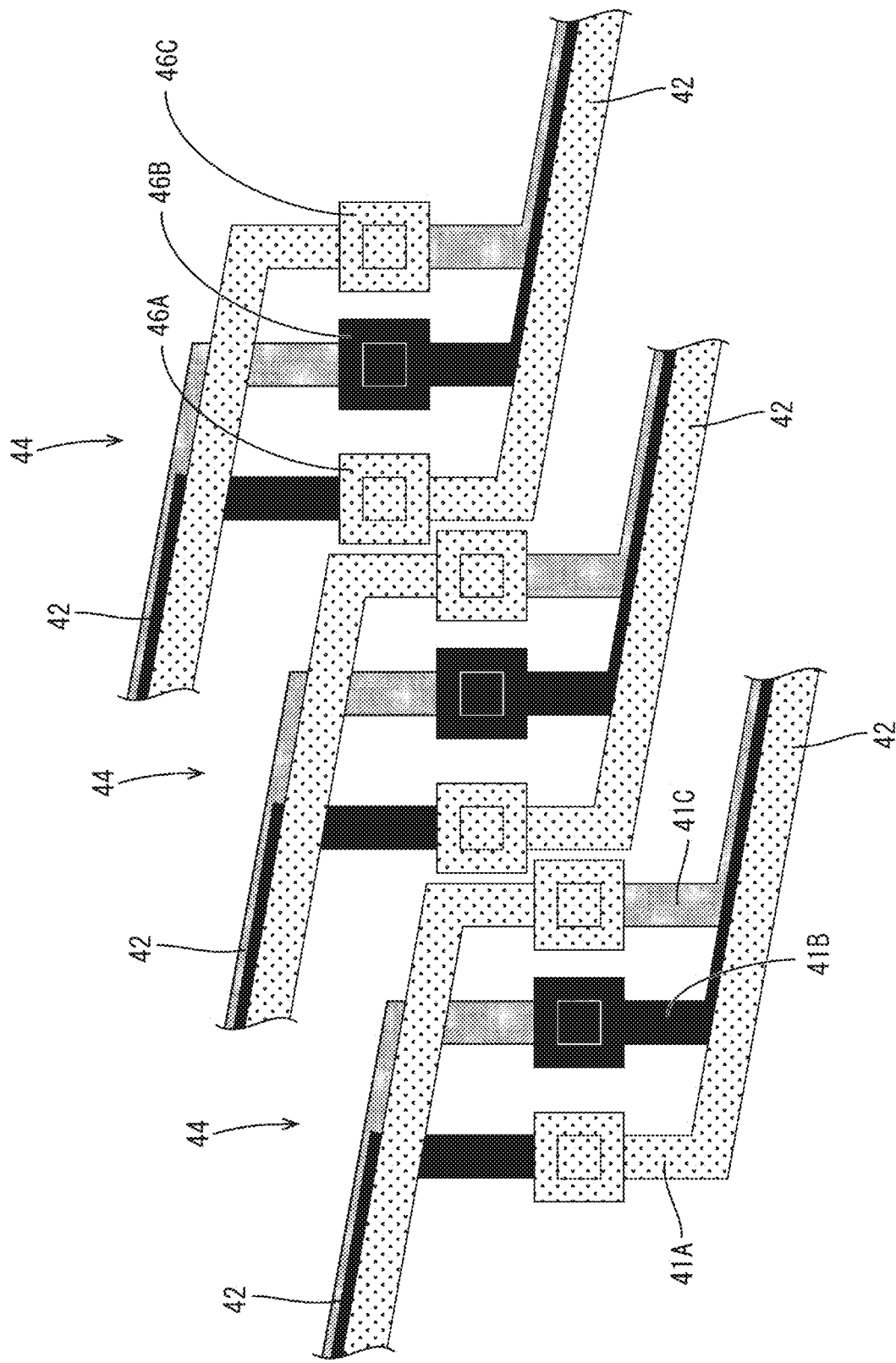
FIG. 11 is a schematic diagram showing a state in which switching contact portions in neighboring image-signal wire groups are aligned.

Also, one switching contact portion 44 in one image-signal wire group 42 in the present embodiment is arranged to be obliquely displaced from the neighboring switching contact portion 44 in the neighboring image-signal wire group 42 with respect to the X-axis direction, as shown in FIG. 11. This allows the neighboring switching contact portions 44 in the neighboring image-signal wire groups 42 to be arranged partly overlapping each other in the X-axis direction, thus making it possible to reduce the wire pitch.

In the present embodiment, the image-signal wire groups 42 are formed simultaneously during formation of the gate wires 31, the source wires 33, and the common-electrode connection wire 38. That is, the first image signal wires 41A are formed of the first metal film, the second image signal wires 41B are formed of the second metal film, and the third image signal wires 41C are formed of the third metal film and can be respectively patterned simultaneously on the array substrate 30 by a known photolithography method during patterning of the gate wires 31 (the first metal film), the source wires 33 (the second metal film), and the common-electrode connection wire 38 (the third metal film).

What is described above is the configuration of the array substrate 30 in the present embodiment, and operational advantages will be described next. The array substrate 30 in the present embodiment comprises the signal input terminals 40 for inputting signals, the column control circuit portion 16 that receives the signals input from the signal input terminals 40, the plurality of image signal wires 41 that provide connections between the signal input terminals 40 and the column control circuit portion 16. The plurality of image signal wires 41 constitutes the image-signal wire groups 42 having an arrangement in which three image signal wires overlap one another with the insulating layers interposed therebetween, and the image-signal wire groups 42 are provided with the switching contact portions 44 at which the transmission paths of the signals respectively input to the image signal wires 41 are switched to other image signal wires 41.

According to this configuration, since the plurality of image signal wires 41 can be aggregated in a plane arrangement, the wiring space can be reduced. Also, the risk of short-circuiting between the neighboring image signal wires 41 is reduced in the oblique wiring portion where the wire pitch is reduced. Thus, even when the wire pitch is reduced owing to an increase in the number of image signal wires 41 or a reduction in the size of the driver 13, the distance between the signal input terminals 40 and the column control circuit portion 16 can be kept small. That is, the size of the array substrate 30 can be kept small.

In addition, the image-signal wire group 42 in the present embodiment comprises the switching contact portions 44, and the signals input to the respective image signal wires 41A, 41B, and 41C are adapted to undergo changes of their transmission paths in the switching contact portions 44. Thus, even when the constituent materials, the widths, the thicknesses, and so on of the image signal wires 41A, 41B, and 41C are different, uniform output signals can be obtained regardless of the intrinsic resistance values.

Also, a total of two switching contact portions 44 are provided at positions at which the image-signal wire group 42, which is constituted by three image signal wires 41, is divided into three portions and are furthermore adapted so that the image-signal wire group 42 is equally divided into the portions. That is, the signals input to the respective image signal wires 41A, 41B, and 41C are transmitted through all the image signal wires 41 in the image-signal wire group 42 by an equal distance, which can obtain more uniform output signals.

Also, the image-signal wire group 42 is constituted by three neighboring image signal wires 41. Accordingly, it is possible to simplify the configuration.

Also, the signal input terminals 40 and the long side of the column control circuit portion 16 are placed in a straight line (the X-axis direction), and one switching contact portion 44 in one image-signal wire group 42 is arranged to be obliquely displaced relative to the neighboring switching contact portion 44 in the neighboring image-signal wire group 42 with respect to the X-axis direction.

According to such a configuration, the neighboring switching contact portions 44 in the neighboring image-signal wire groups 42 can be arranged partly overlapping each other in the X-axis direction, thus making it possible to reduce the wire pitch.

The image signal wires 41 include the gate wires 31, which is formed of the first metal film, the source wires 33, which is formed of the second metal film, and the common-electrode connection wire 38, which is formed of the third metal film. The image-signal wire group 42 includes the first image signal wire 41A, which is formed of the first metal film, the second image signal wire 41B, which is formed of the second metal film, and the third image signal wire 41C, which is formed of the third metal film.

According to such a configuration, during patterning of the gate wires 31 (the first metal film), the source wires 33 (the second metal film), and the common-electrode connection wire 38 (the third metal film), the image signal wires 41A, 41B, and 41C can be simultaneously patterned on the array substrate 30 by a known photolithography method.

Also, in the present embodiment, the image signal wires 41 are provided with the column control circuit portion 16 for driving the source wires 33, and the image-signal wire groups 42 are provided between the signal input terminals 40 and the column control circuit portion 16.

In addition, since the liquid-crystal panel 10 in the present embodiment is configured to comprise the above-described array substrate 30 and the CF substrate 20 that is bonded to the array substrate 30 so as to oppose it, uniform signals can be obtained.

Second Embodiment

Figure 12:
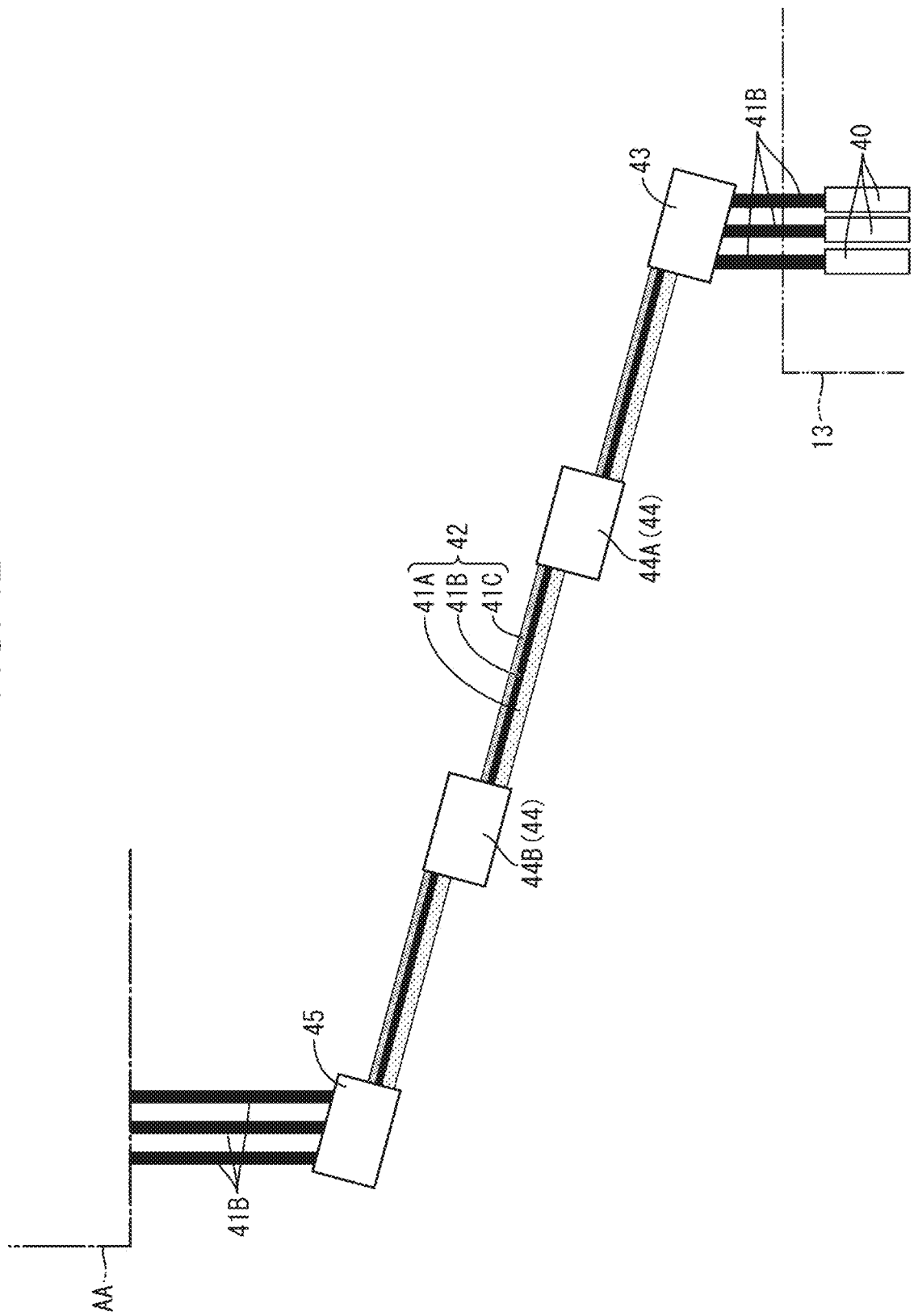
FIG. 12 is a schematic diagram showing a wiring structure of an image-signal wire group in a second embodiment.

Next, a second embodiment of present invention will be described using FIG. 12. In the embodiment below, a description will be given of only configurations that differ from those in the first embodiment, configurations that are similar to those in the first embodiment are denoted by the same reference numerals, and redundant descriptions are omitted. In the present embodiment, two contacts, that is, a driver-side contact 43 and a display-portion-side contact 45, are added, in addition to the two switching contact portions 44A and 44B. Also, there are differences in that the column control circuit portion 16 as in the above-described embodiment is not provided, and an end of each image signal wire 41 whose other end is connected to the signal input terminal 40 is directly connected to the source wire 33 placed in the display area AA.

Three neighboring image signal wires 41B laid out from the signal input terminals 40 to the display area AA side (along the Y-axis direction) in parallel to each other are all formed in the second insulating layer 34 and are also made of the second metal film that is the same as that of the source wires 33. Further, at the driver-side contact 43 provided so as to cover the three image signal wires 41B, the three image signal wires 41B are arranged overlapping one another with insulating layers therebetween to constitute an image-signal wire group 42 and are also routed obliquely so as to extend toward the upper left in FIG. 11 in a fan shape. In this case, two image signal wires at both ends of the three image signal wires 41B placed side by side are respectively connected to the first image signal wire 41A placed in the upper layer in the driver-side contact 43 and the third image signal wire 41C placed in the lower layer. This constitutes the image-signal wire group 42 in which the three image signal wires 41 are arranged overlapping each other.

Also, the overlapping state of the image-signal wire group 42 is dissolved by the display-portion-side contact 45, and the image signal wires are respectively connected to the second image signal wires 41B, which are made of the second metal film that is the same as that of the source wires 33 formed in the second insulating layer 34, and are directly connected to the source wires 33 in the display area AA.

As described above, the driver-side contact 43 and the display-portion-side contact 45, which make the image signal wires 41 overlap each other or dissolved into a desired state, are provided at both ends of the image-signal wire group 42, thereby making it possible to perform wiring with a higher degree of freedom.

Third Embodiment

Figure 13:
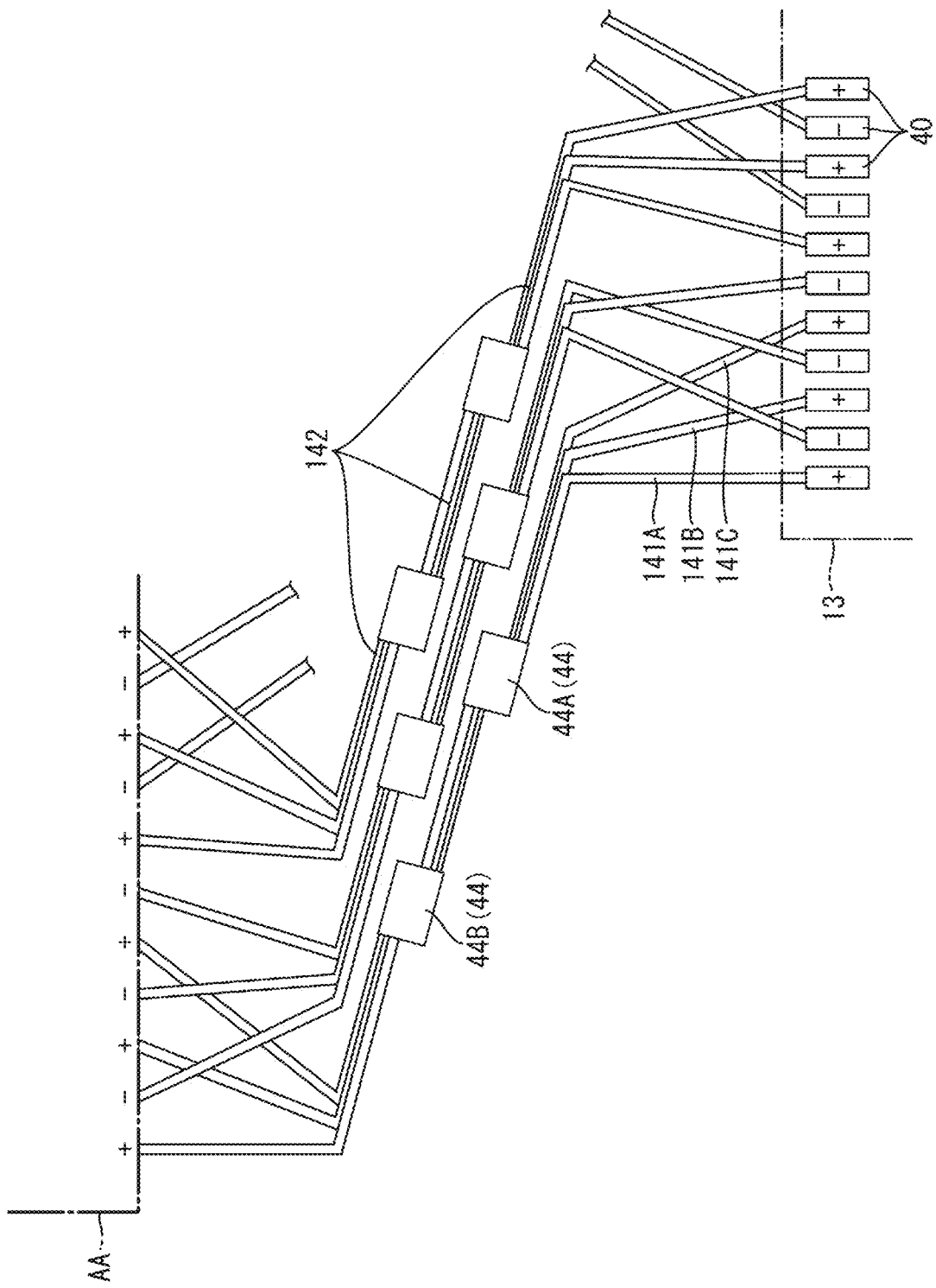
FIG. 13 is a schematic diagram showing a wiring structure in a non-display area of an array substrate in a third embodiment.

Next, a third embodiment of present invention will be described using FIG. 13. In the present embodiment, image signal wires 141 connected to the driver 13 take a form in which they are arranged overlapping one another for every three adjacent image signal wires 141A, 141B, or 141C to which same-polarity signals are input, to constitute an image-signal wire group 142. In this case, the image signal wires 141 do not have to be formed in the same layer, and the image signal wires 141 that intersect each other owing to wiring may be formed in different layers.

As described above, according to the present embodiment in which the image signal wires 141A, 141B, or 141C to which the same-polarity signals are input are made to overlap one another, a reduction in the potential difference between the image signal wires 141 that are made to overlap one another can reduce potential variations in signals transmitted to the pixels.

Fourth Embodiment

Figure 14:
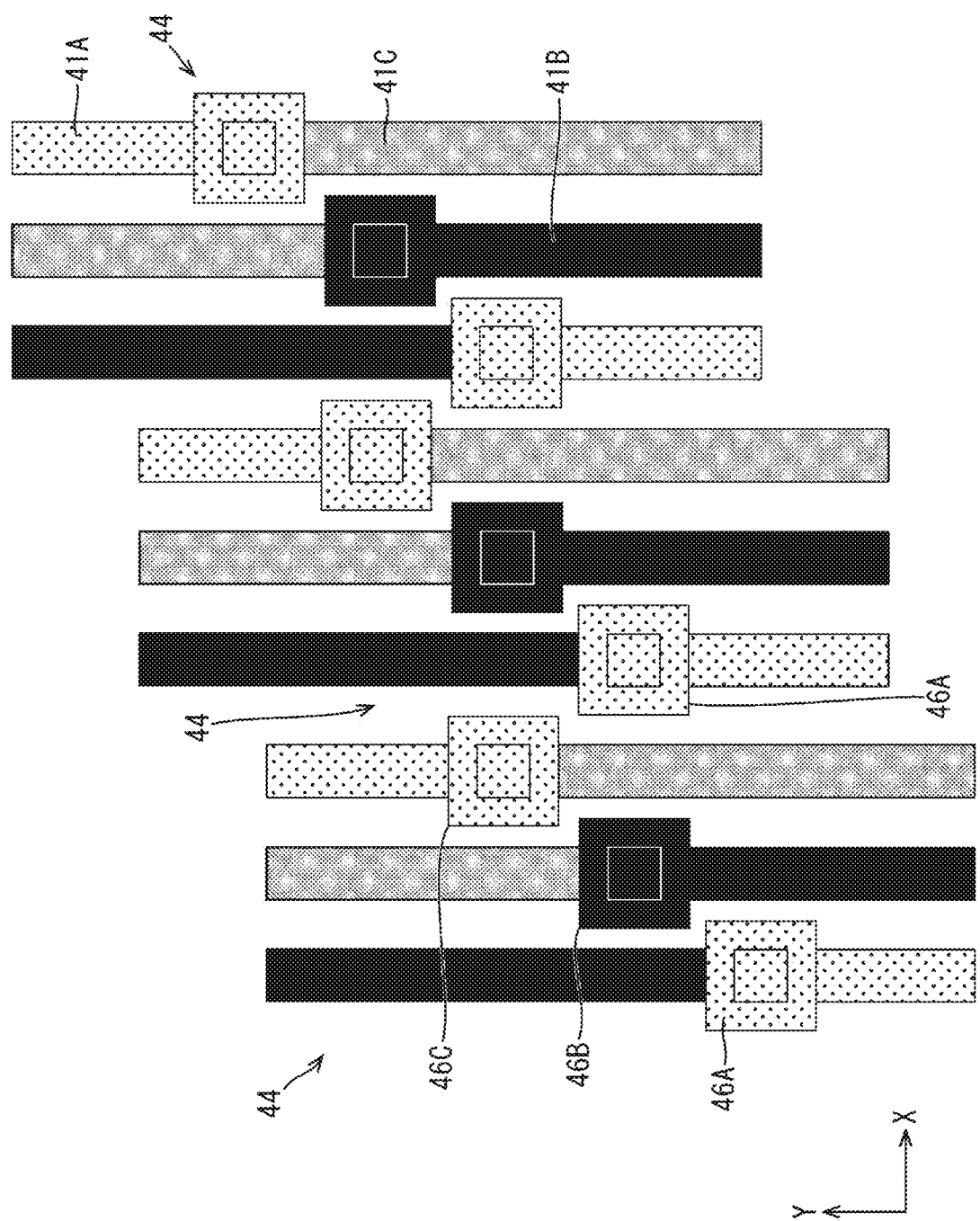
FIG. 14 is a schematic diagram showing a state in which switching contact portions in neighboring image-signal wire groups in a fourth embodiment are aligned.

Next, a fourth embodiment of present invention will be described using FIG. 14. FIG. 14 is a schematic diagram showing the alignment state of three contacts 46A, 46B, and 46C in one switching contact portions 44 and the alignment state of the neighboring contacts 46A in neighboring switching contact portions 44. The overlapping arrangement of the three overlappingly arranged image signal wires 41 in one image-signal wire group 42 is partly dissolved, the image signal wires are placed side by side, as shown in FIG. 14, and also the three contacts 46A, 46B, and 46C, which provide conductive connections between one image signal wire 41 and another image signal wire 41, are aligned in a direction that intersects a direction (the X-axis direction) orthogonal to the extending direction of the image signal wires 41. Also, the third contact 46C in one image-signal wire group 42 and the first contact 46A in the neighboring image-signal wire group 42 are aligned in a direction that intersects the direction (the X-axis direction) orthogonal to the extending direction of the image signal wires 41.

According to such a configuration, since the formation area of the switching contact portions 44 in the X-axis direction can be reduced compared with a case in which the contacts 46A, 46B, and 46C are placed in the direction (the X-axis direction) orthogonal to the extending direction of the image-signal wire groups 42, the wire pitch can be reduced.

Other Embodiments

The present invention is not limited to the embodiments described in the above description and the drawings, and, for example, embodiments as described next are also included in the technical scope of the present invention.

(1) Although, in the above-described embodiments, the first image signal wire 41A, the second image signal wire 41B, and the third image signal wire 41C have a configuration in which they are all formed of different metal films, a part or all of the image signal wires 41A, 41B, and 41C may be constituted by the same type of metal film.

(2) Also, it is possible to arbitrarily change the widths and the thicknesses of the image signal wires 41A, 41B, and 41C. In such a case, the signals input to the image signal wires 41A, 41B, and 41C undergo changes of their transmission paths in the switching contact portions 44, thus cancelling load between the image signal wires 41A, 41B, and 41C and making it possible to obtain uniform signals.

(3) Although, in the above-described embodiments, an example in which all of the signal input terminals 40 are linearly arrayed in one line has been described above, the arrangement is not limited thereto, and the signal input terminals 40 may be arrayed, for example, in zigzags.

(4) Although the configuration is not limited to the above-described embodiments and may be a configuration in which an FPC and the image signal wires 41 are directly connected without involvement of the driver 13.

(5) Although the configuration in the above-described embodiments is configuration in which all of the image signal wires 41 are provided with the image-signal wire groups 42, the configuration may be a configuration in which only a part of the image signal wires 41 is provided with the image-signal wire groups 42.

(6) Although the image signal wires 41 connected to the source wires 33 have been described in the above-described embodiment, the image signal wires connected to the gate wires 31 can also have a similar configuration.

Figure 15:
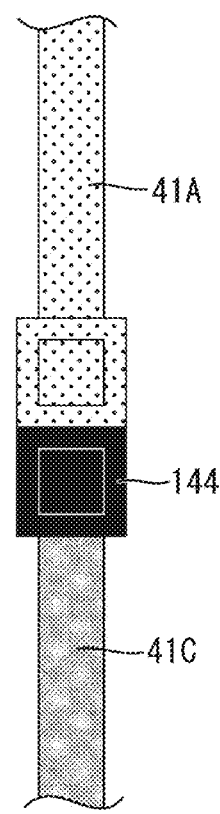
FIG. 15 is a schematic diagram showing a connection structure of image signal wires in another embodiment.
Figure 16:
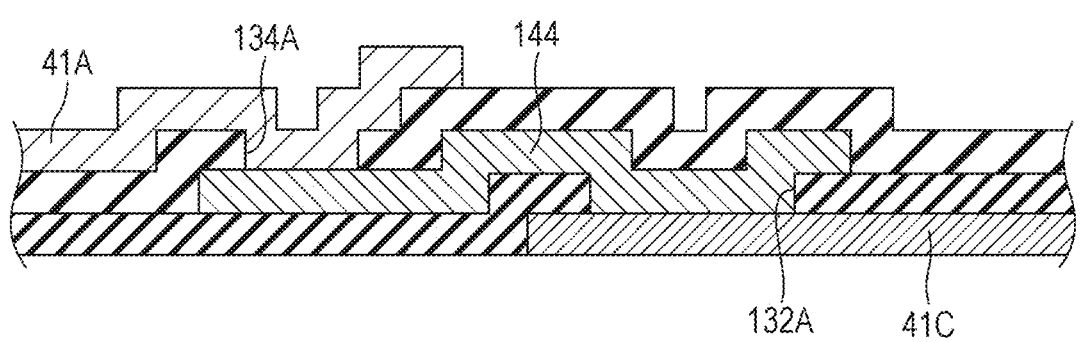
FIG. 16 is a sectional view of FIG. 15.
Figure 17:
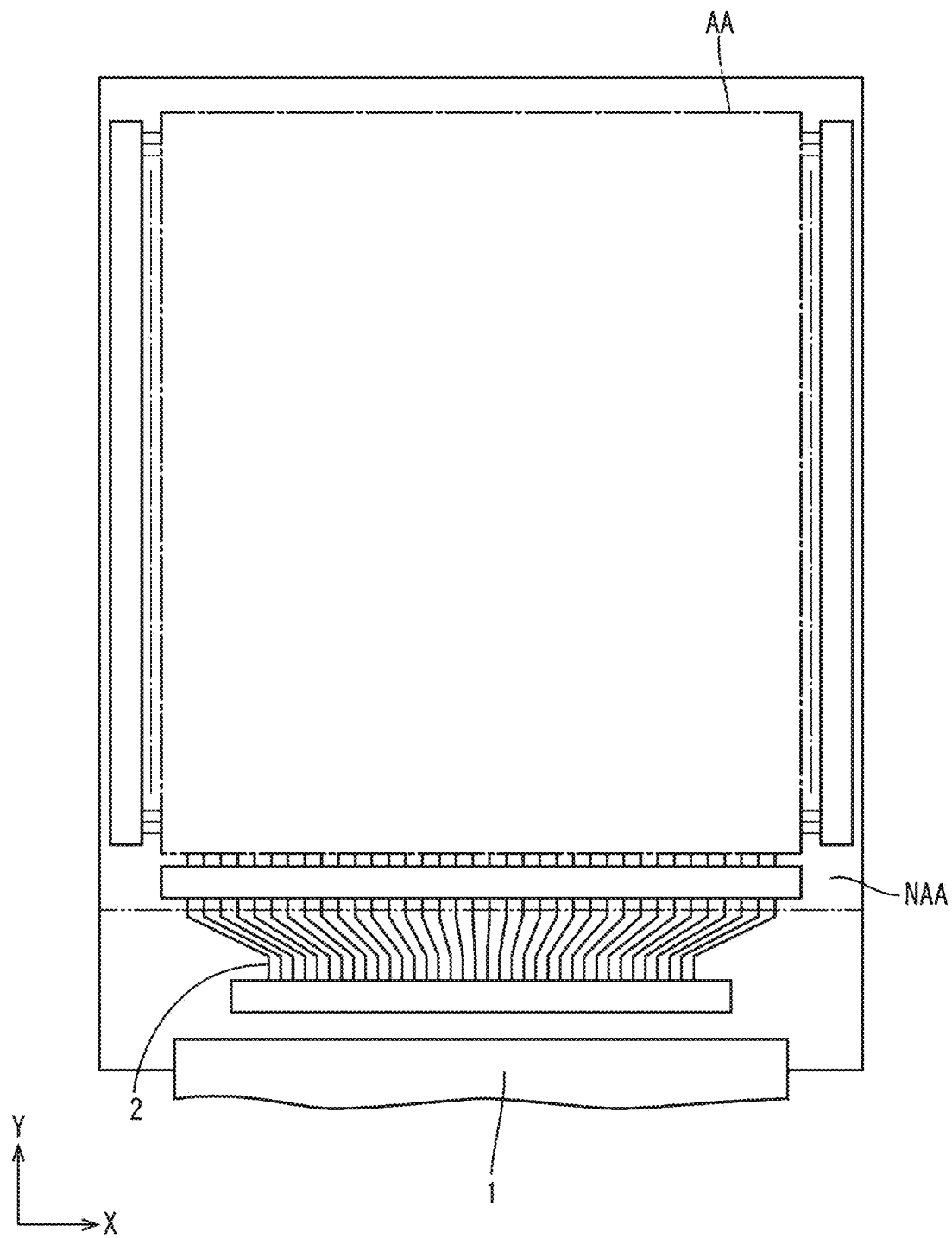
FIG. 17 is a plan view of a conventional array substrate.

(7) Although the configuration in the above-described embodiments is a configuration in which the first image signal wire 41A and the third image signal wire 41C are connected via the island-shaped relay portion 47 through two contact holes 32A and 34A provided at positions that match each other in plan view, the configuration may be a configuration in which the first image signal wire 41A and the third image signal wire 41C are connected via an island-shaped relay portion 144 through two contact holes 132A and 134A that are placed in a displaced manner in plan view, as shown in FIGS. 15 and 16.

(8) The configuration in which one end of each of the first image signal wires 41A, the second image signal wires 41B, and the third image signal wires 41C is connected to one of the signal input terminals 40 formed of one type of metal film has been disclosed in the above-described embodiments. However, the plurality of signal input terminals may be formed of three types of metal films, that is, a first metal film, a second metal film, and a third metal film.

(9) Although an example of the liquid-crystal panel 10 having a configuration in which the liquid-crystal layer 11 is held between the pair of substrates 20 and 30 has been described in the above-described embodiments, for example, an organic EL panel in which functional organic molecules other than a liquid-crystal material are held between a pair of substrates may be used.

(10) The wiring substrate is not limited to the array substrate 30, and the technology in the present invention can be employed for various types of wiring substrate.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A wiring substrate comprising:
signal input portions for inputting signals;
a signal receiving portion that receives the signals input from the signal input portions; and
a plurality of connection wires that provides connections between the signal input portions and the signal receiving portion,
wherein the plurality of connection wires constitutes a connection wire group in which n (n is a natural number greater than or equal to 2) connection wires are arranged overlapping one another with an insulating layer being interposed therebetween, and
the connection wire group is provided with a switching contact portion at which transmission paths of the signals respectively input to the connection wires are switched to the other connection wires.

2. The wiring substrate according to claim 1, wherein a total of (n−1) switching contact portions are provided at positions at which the connection wire group is divided into n.

3. The wiring substrate according to claim 1, wherein the switching contact portions are provided at positions at which the connection wire group is equally divided into n.

4. The wiring substrate according to claim 1, wherein the connection wire group is constituted by n neighboring connection wires.

5. The wiring substrate according to claim 1, wherein the connection wire group is constituted by n connection wires through which same-polarity signals are transmitted.

6. The wiring substrate according to claim 1, wherein, in one switching contact portion, the overlapping arrangement of n overlappingly arranged connection wires in the connection wire group is partly dissolved, the n connection wires are placed side by side and have n unit contacts that provide conductive connection between one connection wire and another connection wire, and the n unit contacts are aligned in a direction that intersects a direction orthogonal to an extending direction of the connection wires that are placed side by side.

7. The wiring substrate according to claim 1,
wherein the signal input portions are or the signal receiving portion is placed in a straight line; and
one switching contact portion in one connection wire group is arranged to be obliquely displaced relative to the neighboring switching contact portion in the neighboring connection wire group and the signal input portions or the signal receiving portion placed in the straight line.

8. The wiring substrate according to claim 1,
wherein the signal receiving portion comprises pixel wires connected to a plurality of pixels for displaying an image, the pixels being located in a display area in which the pixels are formed;
the signal input portions are pixel signal input portions for inputting signals to the pixel wires; and
the plurality of connection wires is routed from the plurality of pixel signal input portions to the plurality of pixel wires so as to extend in a fan shape.

9. The wiring substrate according to claim 8,
wherein the pixel wires include a scan wire made of a first electrical conductor, an image wire made of a second electrical conductor, and a common-electrode connection wire made of a third electrical conductor; and
the connection wire group includes a first connection wire made of the first electrical conductor, a second connection wire made of the second electrical conductor, and a third connection wire made of the third electrical conductor.

10. The wiring substrate according to claim 8,
wherein the connection wires are provided with a drive circuit for driving the pixel wires, and the connection wire group is provided between the pixel signal input portions and the drive circuit.

11. A display panel comprising:
the wiring substrate according to claim 1; and
an opposing substrate that is bonded to the wiring substrate so as to oppose the wiring substrate.

* * * * *